(12) United States Patent
Samsonidze et al.

(10) Patent No.: US 10,629,793 B2
(45) Date of Patent: Apr. 21, 2020

(54) HALF-HEUSLER COMPOUNDS FOR USE IN THERMOELECTRIC GENERATORS

(71) Applicant: Robert Bosch GmbH, Stuttgart (DE)

(72) Inventors: Georgy Samsonidze, Dorchester, MA (US); Boris Kozinsky, Waban, MA (US)

(73) Assignee: Robert Bosch GmbH, Stuttgart (DE)

( * ) Notice: Subject to any disclaimer, the term of this patent is extended or adjusted under 35 U.S.C. 154(b) by 846 days.

(21) Appl. No.: 14/943,069

(22) Filed: Nov. 17, 2015

(65) Prior Publication Data

US 2017/0141282 A1    May 18, 2017

(51) Int. Cl.
| | |
|---|---|
| *H01L 35/22* | (2006.01) |
| *F01N 5/02* | (2006.01) |
| *C22C 27/02* | (2006.01) |
| *C22C 27/00* | (2006.01) |
| *H01L 35/32* | (2006.01) |

(52) U.S. Cl.
CPC .............. *H01L 35/22* (2013.01); *C22C 27/00* (2013.01); *C22C 27/02* (2013.01); *F01N 5/025* (2013.01); *H01L 35/325* (2013.01); *Y02T 10/16* (2013.01)

(58) Field of Classification Search
CPC ......... H01L 35/00; H01L 35/02; H01L 35/12; H01L 35/14; H01L 35/22; H01L 35/225
See application file for complete search history.

(56) References Cited

U.S. PATENT DOCUMENTS

| | | | | |
|---|---|---|---|---|
| 3,020,325 | A  * | 2/1962 | Winckler | G01K 7/04 |
| | | | | 136/208 |
| 2004/0261833 | A1* | 12/2004 | Ono | C22C 30/00 |
| | | | | 136/236.1 |
| 2007/0034245 | A1* | 2/2007 | Nakajima | C22C 12/00 |
| | | | | 136/205 |
| 2009/0038667 | A1 | 2/2009 | Hirono et al. | |
| 2010/0163091 | A1* | 7/2010 | Liu | H01L 35/20 |
| | | | | 136/236.1 |

FOREIGN PATENT DOCUMENTS

WO     2015130364 A2    9/2015

OTHER PUBLICATIONS

International Search Report corresponding to PCT Application No. PCT/EP2016/076777 (6 pages).

(Continued)

*Primary Examiner* — Christina Chern
(74) *Attorney, Agent, or Firm* — Maginot, Moore & Beck LLP

(57) ABSTRACT

A thermoelectric generator includes a hot side heat exchanger, a cold side heat exchanger, a plurality of n-type semiconductor legs arranged between the hot side heat exchanger and the cold side heat exchanger, and a plurality of p-type semiconductor legs arranged between the hot side heat exchanger and the cold side heat exchanger and alternating electrically in series with the plurality of n-type semiconductor legs. At least one of the plurality of n-type semiconductor legs and the plurality of p-type semiconductor legs is formed of an alloy having a half-Heusler structure and comprising Si and Sn with molar fractions of x Sn and 1−x Si, and x is less than 1.

18 Claims, 3 Drawing Sheets

(56) References Cited

OTHER PUBLICATIONS

Appel, O et al., "A Comparison Between the Effects of Sb and Bi Doping on the Thermoelectric Properties of the Ti0.3Zr0.35Hf0.35NiSn Half-Heusler Alloy", Journal of Electronic Materials, vol. 43, No. 6, 2014, pp. 1976-1982 (7 pages).
Page, Alexander et al., "A first-principles approach to half-Heusler thermoelectrics: Accelerated prediction and understanding of material properties", Journal of Materiomics, vol. 2, No. 2, 2016, pp. 104-113 (10 pages).
Gulp, Slade et al., "Effect of substitutions on the thermoelectric figure of merit of half-Heusler phases at 800° C.", Applied Physics Letters, vol. 88, No. 4, 2006, pp. 042106-1-042106-3 ( 3pages).
Lee, Ping-Jen et al., "High-temperature thermoelectric properties of Ti0.5(ZrHf)0.5-xNbxNi0.9Pd0.1Sn0.98Sb0.02 half-Heusler alloys", Journal of Alloys and Compounds, vol. 504, No. 1, 2010, pp. 192-196 (5 pages).
Yu, Cui et al., "High-performance half-Heusler thermoelectric materials Hf1-x ZrxNiSn1-ySby prepared by levitation melting and spark plasma sintering", Acta Materialia, vol. 57, No. 9, 2009, pp. 2757-2764 (8 pages).
Bartholomé, Killian et al., "Thermoelectric Modules Based on Half-Heusler Materials Produced on Large Quantities", Journal of Electronic Materials, vol. 43, No. 6, 2013, pp. 1775-1781 (7 pages).
Bulman, Gary et al., "High-efficiency energy harvesting using TAGS-85/half-Heusler thermoelectric devices", Proc. of SPIE, vol. 9115, 2014, pp. 911507-1-911507.8 (8 pages).
Jesús Carrete et al. "Finding unprecedentedly low-thermal-conductivity half-Heusler semiconductors via high-throughput materials modeling." Physical Review X, vol. 4, No. 1, p. 011019, 2014.
Jivtesh Garg et al., "Role of Disorder and Anharmonicity in the Thermal Conductivity of Silicon-Germanium Alloys: A First-Principles Study." Physical Review Letters, vol. 106, No. 4, p. 045901, 2011.
Y.P. Yarmolyuk et al., "Compounds with the TiNiSi structure in the systems of two transition metals and either Si or Ge." Visn. Lviv. Derzh. Univ., Seriya Khimicheskaya, vol. 11, p. 14, 1969. (No reference available).
R.V. Skolozdra et al., "The supersound influence on the hysteresis of voltage-brightness characteristics causing a native memory in thin-film electroluminescent ZnS." Ukrainskii Fizichnii Zhurnal, Russ. Ed., vol. 31, p. 1258, 1986. (No reference available).
W. Jeitschko et al., "V and E Phases in Ternary Systems with Transition Metals and Silicon or Germanium." Transactions of the Metallurgical Society of AIME, vol. 245, p. 335, 1969.
G.A. Landrum et al., "The TiNiSi Family of Compounds: Structure and Bonding." Inorganic Chemistry, vol. 37, No. 22, p. 5754, 1998.
Y.V. Stadnyk et al., "Effect of high dopping in TiNiSn semiconductor by V impurity on thermopower factor of TiNi1-xVxSn solid solution alloys." Visnyk Lviv. Derzh. Univ., Seriya Khimicheskaya, vol. 51, p. 97, 2010.
M. Conrad et al., "Refinement of the crystal structure of monovanadium monocobalt monosilicide, VCoSi." Z. Kristallogr.—New Cryst. Struct., vol. 220, p. 319, 2005.
P. Giannozzi et al., "Quantum Espresso: a modular and open-source software project for quantum simulations of materials." Journal of Physics: Condensed Matter, vol. 21, No. 39, p. 395502, 2009.
P.I. Kripyakevich et al., "Crystal structures of ternary compounds in the systems Ti(V)Fe(Co,Ni)—Sn(Sb)." Dopov. Akad. Nauk Ukr. RSR, vol. 1963, p. 1606, 1963. (No reference available).
Giri Joshi et al., "Enhancement in Thermoelectric Figure-Of-Merit of an N-Type Half-Heusler Compound by the Nanocomposite Approach." Advanced Energy Materials, vol. 1, No. 4, p. 643, 2011.

* cited by examiner

HALF-HEUSLER COMPOUNDS FOR USE IN THERMOELECTRIC GENERATORS

This invention was made with government support under DE-EE0004840 awarded by the Department of Energy-Office of Energy Efficiency and Renewable Energy. The government has certain rights in the invention.

TECHNICAL FIELD

This disclosure relates generally to molecular compounds, and more particularly to molecular compounds for use in thermoelectric generators.

BACKGROUND

Fuel efficiency of motor vehicles can be improved by integrating a thermoelectric generator in heated areas of the vehicle. The thermoelectric generator converts waste heat from the internal combustion engine into electricity according to the principles of the Seebeck Effect. Since excess heat is present in numerous locations in the vehicle, in particular in the exhaust system, using a thermoelectric generator in the exhaust converts heat energy that would ordinarily be wasted into useful electric energy.

Conventional thermoelectric generators include a hot-side heat exchanger and a cold-side heat exchanger, which are separated by a plurality of semiconductor modules. In a typical thermoelectric generator, n-type semiconductors and p-type semiconductors are electrically connected in series such that the n-type and p-type semiconductors alternate along the electric path. The p-type and n-type semiconductors are typically arranged between the hot-side heat exchanger and the cold-side heat exchanger so as to be thermally in parallel with each other.

When heat passes through the thermoelectric generator, the charge carriers of the semiconductors within the generator diffuse from the hot-side heat exchanger to the cold-side exchanger. The build-up of charge carriers results in a net charge, producing an electrostatic potential, while the heat transfer drives a current through the series-connected semiconductor elements. This production of electric energy is known as the Seebeck Effect.

In a vehicle exhaust system, temperatures can reach 700° C. (~1300° F.) or more, and the resulting temperature difference between exhaust gas on the hot side and coolant on the cold side is therefore several hundred degrees. A vehicle exhaust having a thermoelectric generator uses the Seebeck principle to convert the temperature difference in the exhaust system through the p-type and n-type semiconductors of the thermoelectric generator into a potential difference. The resulting electric energy can be used to power electrical components in the vehicle, charge the battery in the vehicle, or, in hybrid vehicles, power the vehicle drivetrain.

The efficiency of heat to electricity conversion for a given semiconductor material is quantified by a dimensionless parameter called the figure of merit (ZT), which is calculated according to the equation:

$$ZT=\delta S^2 T/(\kappa_{el}+\kappa_{lat}),$$

where σ is the electrical conductivity, S is the Seebeck coefficient, T is temperature, $\kappa_{el}$ is the electronic thermal conductivity, and $\kappa_{lat}$ is the lattice thermal conductivity.

A material having a greater figure of merit results in more energy produced at a given temperature differential between the hot and cold side heat exchangers. As such, it is desirable for the semiconductor elements of a thermoelectric generator to be formed of materials with high figure of merit in order to improve efficiency and electricity generation in a thermoelectric generator.

SUMMARY

In one embodiment, a thermoelectric generator includes a hot side heat exchanger, a cold side heat exchanger, a plurality of n-type semiconductor legs arranged between the hot side heat exchanger and the cold side heat exchanger, and a plurality of p-type semiconductor legs arranged between the hot side heat exchanger and the cold side heat exchanger and alternating electrically in series with the plurality of n-type semiconductor legs. At least one of the plurality of n-type semiconductor legs and the plurality of p-type semiconductor legs is formed of an alloy having a half-Heusler structure and comprising Si and Sn with molar fractions of x Sn and 1−x Si, where x is less than 1.

In one embodiment, the alloy comprises $NbCoSi_{1-x}Sn_x$ and x is greater than 0.27.

In another embodiment, the alloy comprises $TaCoSi_{1-x}Sn_x$ and x is greater than 0.21.

In a further embodiment, the alloy comprises $TiNiSi_{1-x}Sn_x$ and x is greater than 0.36.

In yet another embodiment, the alloy comprises $VCoSi_{1-x}Sn_x$ and x is greater than 0.27.

In another embodiment, a vehicle comprises an engine, an exhaust system operably connected to the engine so as to receive exhaust from the engine and discharge the exhaust to an outlet. The exhaust system includes a thermoelectric generator comprising a hot side heat exchanger;

a cold side heat exchanger, a plurality of n-type semiconductor legs arranged between the hot side heat exchanger and the cold side heat exchanger, and a plurality of p-type semiconductor legs arranged between the hot side heat exchanger and the cold side heat exchanger and connected alternating electrically in series with the plurality of n-type semiconductor legs. At least one of the plurality of n-type semiconductor legs and the plurality of p-type semiconductor legs is formed of an alloy having a half-Heusler structure and comprising Si and Sn with molar fractions of x Sn and 1−x Si, and x is less than 1.

In another embodiment of the vehicle, the alloy comprises $NbCoSi_{1-x}Sn_x$ and x is greater than 0.27.

In a further embodiment of the vehicle, the alloy comprises $TaCoSi_{1-x}Sn_x$ and x is greater than 0.21.

In another embodiment according to the disclosure, a semiconductor alloy comprises a first element selected from one of group IV-B and group V-B, a second element selected from group VIII, Sn with a molar fraction of x, Si with a molar fraction of 1−x, and a doping agent. The semiconductor alloy has a half-Heusler structure, and x is less than 1.

In some embodiments of the alloy, the first element includes one element selected from the group consisting of Nb, Ta, Ti, and V. In further embodiments, the second element includes one element selected from the group consisting of Co and Ni.

In another embodiment of the alloy, the first element is Nb, the second element is Co, and x is greater than 0.27. In one particular embodiment, x is between 0.27 and 0.50.

In some embodiments, the first element is Ta, the second element is Co, and x is greater than 0.21. In a particular embodiment, x is between 0.21 and 0.50.

In a further embodiment of the alloy, the first element is Ti, the second element is Ni, and x is greater than 0.36. In one embodiment, x is between 0.36 and 0.50.

In another embodiment of the alloy, the first element is V, the second element is Co, and x is greater than 0.27.

In yet another embodiment of the alloy, the semiconductor alloy is an n-type semiconductor element formulated as $ABSi_{[(1-x)(1-y)]}Sn_{[x(1-y)]}D_y$, wherein A is the first element, B is the second element, and D is the doping agent.

In a further embodiment, the semiconductor alloy is a p-type semiconductor element formulated as $A_{1-y}BSi_{(1-x)}Sn_xD_y$, wherein A is the first element, B is the second element, and D is the doping agent.

DETAILED DESCRIPTION

For the purposes of promoting an understanding of the principles of the embodiments described herein, reference is now made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

Figure 1:
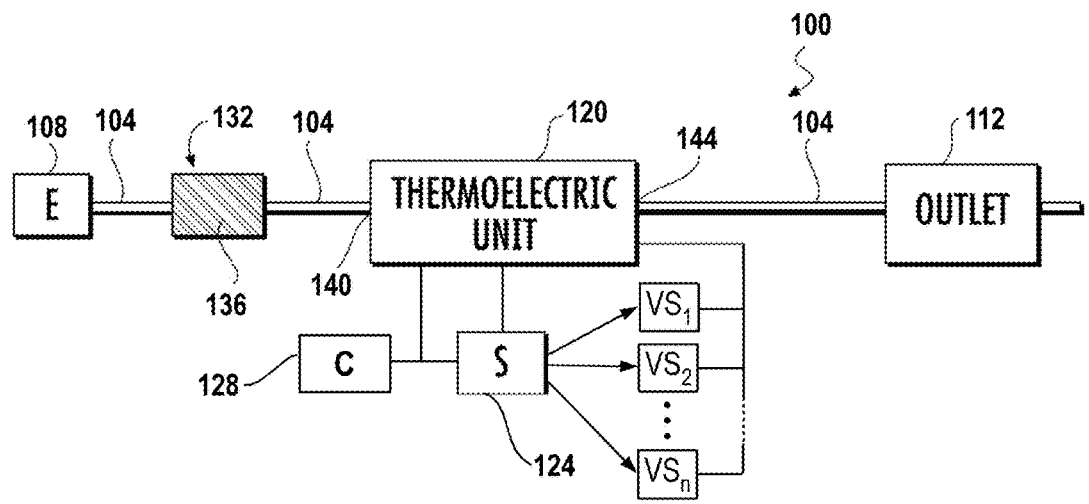
FIG. 1 is a schematic view of a vehicle exhaust system incorporating a thermoelectric generator according to the disclosure.

FIG. 1 illustrates a vehicle exhaust system 100, shown in the generalized schematic of FIG. 1, which includes an exhaust pipe 104 that directs heated exhaust gases from an internal combustion engine 108 to an exhaust system outlet 112, for example a tailpipe of the vehicle. In some embodiments, the exhaust system 100 includes additional exhaust components (not shown) positioned between the engine 108 and the outlet 112, such as mufflers, resonators, catalysts, etc.

A thermoelectric generator 120 is incorporated into the exhaust system and in particular integrated into the exhaust pipe 104 to transform heat generated by exhaust gases into electrical energy/power. The thermoelectric generator 120 is operably connected to an energy storage device 124 and is configured to store the generated electrical energy in the storage device 124, which, in some embodiments, includes a rechargeable battery configured to provide the electrical energy to various vehicle systems $VS_1$, $VS_2$ ... $VS_n$ as desired. In various embodiments, the vehicle systems $VS_1$, $VS_2$ ... $VS_n$ include engine controls, exhaust system controls, a door lock system, window lifting mechanism, interior lighting, interior electronics, the vehicle drivetrain, etc.

In some embodiments, a controller 128 is operably connected to the storage device 124 and/or the thermoelectric generator 120 to control the storage and usage of the electrical energy generated by the thermoelectric generator 120.

In some embodiments, a temperature control device 132 is operably connected to the exhaust pipe 104, such as in the exhaust pipe 104 upstream of the thermoelectric generator 120. The temperature control device 132 is a cooling device 136 that cools heated exhaust gases to temperatures within a specified temperature range that is between the upper and lower temperature limits of materials used to construct the thermoelectric generator 120. These cooled exhaust gases are then communicated to an inlet 140 to the thermoelectric generator 120.

In various embodiments, the cooling device 136 includes different types of cooling components. For example, in one embodiment, the cooling device 136 includes a fluid cooled heat exchanger, while in another embodiment, the cooling device 136 includes air or water injection for cooling. In another embodiment, the cooling device 136 has an air gap pipe combined with air injection or forced air cooling, which provides both cooling and a potential reduction in thermal inertia to avoid faster heat up. In further embodiments, the cooling device 136 is configured to incorporate the function of a compression assembly, discussed below, in particular by directing coolant or cooling effects to the cold-side heat exchanger of the thermoelectric generator 120.

In some embodiments, no cooling device is positioned between the thermoelectric generator 120 and the engine 108, for example in embodiments in which the materials of the thermoelectric generator 120 are configured to receive exhaust at high temperatures.

As the exhaust gases pass through the thermoelectric generator 120, waste heat from the exhaust gases is transformed into electrical energy. The exhaust gas then exits the thermoelectric generator 120 via an outlet 144. The illustrated configuration is a non-bypass arrangement, in which all of the exhaust gases flow through the thermoelectric generator 120. In other embodiments, only a portion of the exhaust gases flow through the thermoelectric generator 120, while the remainder of the exhaust gases bypass the thermoelectric generator 120. In a further embodiment, the exhaust system includes multiple thermoelectric generators 120 arranged in parallel in the exhaust pipe 104, and the exhaust pipe 104 is branched so as to split the exhaust gases between the thermoelectric generators 120.

Figure 2:
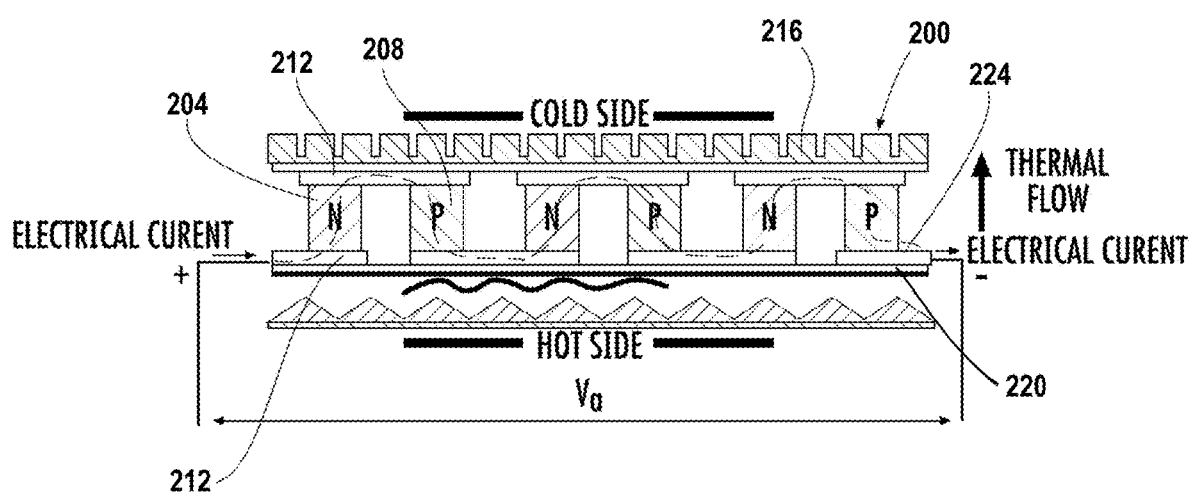
FIG. 2 is a schematic view of the thermoelectric generator of the exhaust system of FIG. 1.

The key components of the thermoelectric generator 120 are the thermoelectric modules which convert the heat flux into electric power. The configuration and operation of the thermoelectric module 200 is depicted in FIG. 2. The thermoelectric module 200 includes alternating n-type and p-type semiconductor legs, 204 and 208, respectively, that are electrically connected in series by conductor elements 212.

The legs 204 and 208 and conductor elements 212 are sandwiched between a cold side substrate 216 and a hot side substrate 220. The temperature gradient between the cold side substrate 216 and the hot side substrate 220 drives the electric current 224 in each leg according to the Seebeck effect, $E_{emf}=-s\Delta T$, where S is the Seebeck coefficient which is a property of the local material, and $\nabla T$ is the temperature gradient across the semiconductor legs.

The materials used for the n-type and p-type semiconductor legs 204 and 208, respectively, have a significant impact on the efficiency of the power generation by the thermoelectric generator. In particular, as discussed above, the thermal conductivity, electrical conductivity, and Seebeck coefficient of a material impact the figure of merit (ZT). As is discussed in more detail below, one or both of the n-type and p-type semiconductor legs 204 and 208, respectively, are formed of a half-Heusler phase alloy containing Silicon (Si) and Tin (Sn) in a molar fraction $Si_{1-x}Sn_x$.

In various embodiments, the n-type and/or p-type semiconductor legs 204, 208 are formed of materials having the chemical formula XYZD, where "X" is typically a transition metal in the IV-B or V-B group, for example Titanium (Ti), Zirconium (Zr), Hafnium (Hf), Vanadium (V), Niobium (Nb), or Tantalum (Ta). "Y" is typically selected from group VIII of the transition metals, for example Cobalt (Co), Rhodium (Rh), Iridium (Ir), Nickel (Ni), Palladium (Pa), or Platinum (Pt). The "Z" represents the $Si_{1-x}Sn_x$ portion of the alloy discussed above.

"D" represents a doping agent, or charge carrier, which is added in small amounts to the alloy in place of one of the above elements so that the semiconductor has extra electrons (in n-type semiconductors) or "holes," which are open spaces for electrons (in p-type semiconductors). In n-type semiconductors, the doping agent is generally an element having one more valence electron than the "Z" element, and replaces a small portion of the "Z" element. For example, in some embodiments, Antimony (Sb), which is in group V-A, replaces a small portion of the $Si_{1-x}Sn_x$ portion of the alloy. In p-type semiconductors, the doping agent is typically a transition element having one less valence electron than the "X" element (i.e. is one group to the left of the "X" element in the Periodic Table). For example, in some embodiments, Ti (group IV-B) is the doping agent in an alloy in which the "X" element is Ta (group V-B), such that Ti replaces a small portion of the Ta to produce holes in the semiconductor.

Figure 3A:
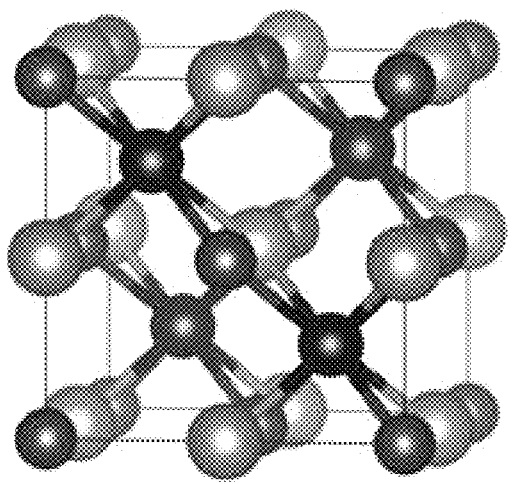
FIG. 3A is a perspective view of a unit cell of NbCoSi in the half-Heusler phase.
Figure 3B:
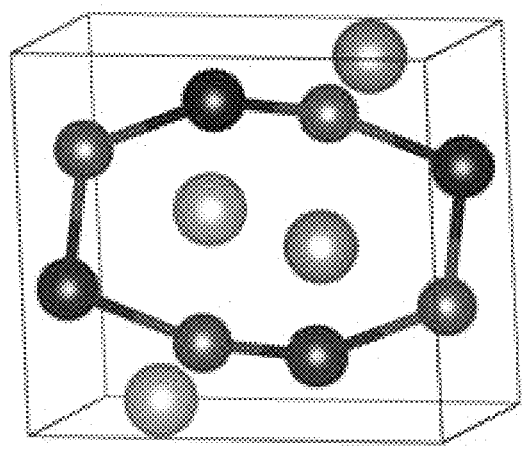
FIG. 3B is a perspective view of a unit cell of NbCoSi in the orthorhombic phase.

The crystalline structure of the alloy compound also affects the figure of merit of the alloy. Depending on the elements used in an alloy, an alloy may be stable in an orthorhombic structure or a half-Heusler structure. As an example, FIG. 3A illustrates the unit cell of the half-Heusler phase, also referred to space group F-43m (216), of NbCoSi, while FIG. 3B illustrates the orthorhombic phase, also referred to as space group Pnma (62), of NbCoSi. In FIG. 3A, it can be seen that the atoms in the half-Heusler structure are uniformly packed together in a cubic structure, while the orthorhombic structure results in atoms that are not as tightly packed and are not as uniformly spaced.

The half-Heusler structure of FIG. 3A results in a narrower band gap compared to the orthorhombic structure. The band gap is a measure of the energy between the top of the valence electron band and the bottom of the conduction band in the alloy. A greater, or wider, band gap in a semiconductor means increased energy is required for the electrons to move in the semiconductor. As a result, alloys having a greater, or wider, band gap have reduced electrical conductivity, while alloys having a lower, or narrower, band gap have greater electrical conductivity.

As discussed above, the figure of merit (ZT) is directly proportional to the electrical conductivity ($\sigma$) of the material used in the thermoelectric generator. Thus, it is advantageous to use semiconductors having a greater electrical conductivity, and thus a narrower band gap. Consequently, materials in the half-Heusler phase typically have a greater figure of merit compared to materials in the orthorhombic phase, and it is therefore desirable to use alloys that are stable in the half-Heusler phase as the semiconductors in the thermoelectric generators.

Certain materials having Si as the "Z" element have been calculated to have promising thermoelectric properties when in the half-Heusler phase. In particular, NbCoSi and TaCoSi are projected to have promising thermoelectric properties. The compositions of these materials are similar to the Sn-based alloys, NbCoSn and TaCoSn, which are disclosed in Publication No. WO 2015/130364, the contents of which are hereby incorporated by reference in their entirety.

Figure 4:
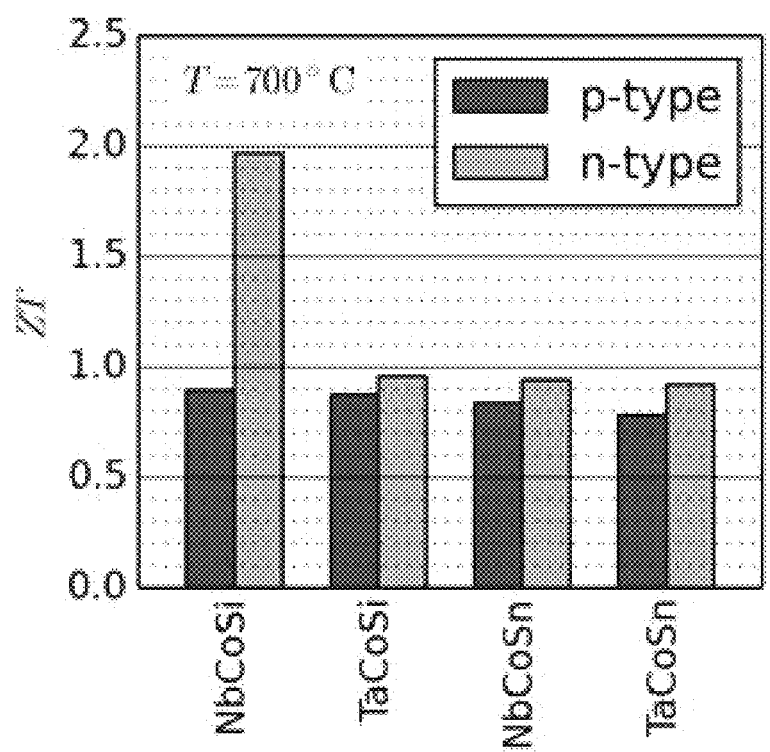
FIG. 4 is a graph showing calculated figure of merit values for half-Heusler phase n-type and p-type semiconductors of NbCoSi, TaCoSi, NbCoSn, and TaCoSn optimized for charge carrier concentration.

FIG. 4 is a graph of the ZT values calculated for NbCoSi, TaCoSi, NbCoSn, and TaCoSn. The computational approach used in determining the ZT for the above compounds is the same as the approach used in WO 2015/130364, where the ab initio derived ZT for each material is optimized with respect to the charge carrier, or doping agent, concentration. The charge carrier, or doping agent, levels are given below in Table 1. It can be seen from FIG. 4 that, in particular, NbCoSi n-type semiconductor has a high ZT value optimized for charge carrier concentration.

TABLE 1

|  | p-type (molar fraction of Ti doped in place of Nb or Ta) | n-type (molar fraction of Sb doped in place of Si or Sn) |
| --- | --- | --- |
| NbCoSi | 0.02 | 0.002 |
| TaCoSi | 0.05 | 0.02 |
| NbCoSn | 0.06 | 0.03 |
| TaCoSn | 0.06 | 0.02 |

According to the Landolt-Bornstein database, however, the half-Heusler phase of NbCoSi is not stable. In other words, the half-Heusler phase has a greater thermodynamic energy compared to the orthorhombic phase. Since compounds naturally react toward lower thermodynamic energy states, the half-Heusler phase of NbCoSi naturally reacts to become the orthorhombic phase. As such, NbCoSi cannot be used as a semiconductor element in a thermodynamic generator.

Even though the pure Si phases are not stable, however, it has been discovered that enhanced thermoelectric performance is obtained by alloying the Si phases of certain materials with the stable Sn-based half-Heusler phases of the compounds. Such alloys have the formula $X_1Y_1Si_{1-x}Sn_x$. For the sake of simplicity, the doping agent "D" is omitted in the following discussion with the understanding that the preferred quantity of doping agent is calculated and added to replace the "X" compound (for p-type semiconductors) or the $Si_{1-x}Sn_x$ (for n-type semiconductors), as is generally described in WO/2015/130364.

According to the Landolt-Bornstein database, NbCoSi exists in the orthorhombic phase, while NbCoSn exists in the half-Heusler phase; TaCoSi exists in the orthorhombic phase, while TaCoSn exists in the half-Heusler phase; TiNiSi exists in the orthorhombic phase, while TiNiSn exists in the half-Heusler phase; and VCoSi exists in the orthorhombic phase, while VCoSn exists in the half-Heusler phase. In various embodiments, however, the half-Heusler phase of $NbCoSi_{1-x}Sn_x$, $TaCoSi_{1-x}Sn_x$, $TiNiSi_{1-x}Sn_x$, and $VCoSi_{1-x}Sn_x$ alloys are stable at particular values of x. While the above alloys are described herein in detail, the reader should appreciate that in some embodiments, other "X" and "Y" compounds, such as those discussed above, are mixed with the Si and Sn to form semiconductor elements having the desired thermoelectric properties.

Figure 5A:
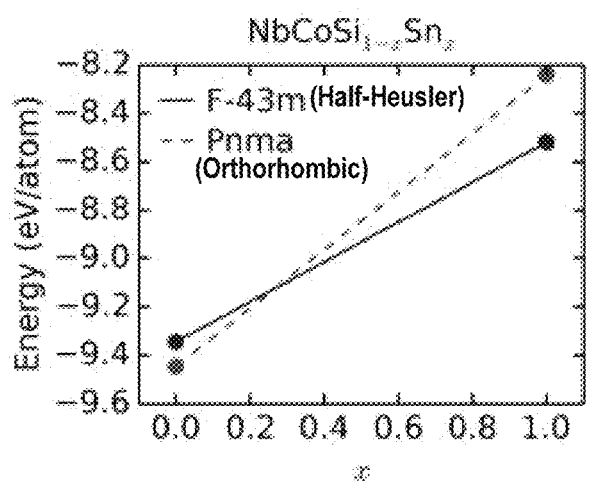
FIG. 5A is a phase diagram showing the energy levels of the half-Heusler phase and the orthorhombic phase of $NbCoSi_{1-x}Sn_x$.

FIG. 5A illustrates the phase diagram for $NbCoSi_{1-x}Sn_x$ illustrating the competition between the half-Heusler and orthorhombic phases at different values of x. The phase diagram was calculated for the molar fractions of Sn (x) on the Si site between x=0 and x=1 using the density-functional theory as implemented in the Quantum ESPRESSO package.

As can be seen from FIG. 5A, the orthorhombic phase has a lower total energy for values of x that are less than approximately 0.27. As such, the orthorhombic phase of $NbCoSi_{1-x}Sn_x$ is stable for x<0.27. The orthorhombic and half-Heusler energy levels cross at approximately x=0.27, and above the x value of 0.27, the half-Heusler phase has a lower total energy than the orthorhombic phase. Thus, for x>0.27, the half-Heusler phase is stable.

In some embodiments of the thermoelectric module 200 in which the n-type semiconductor legs 204 are formed of the $NbCoSi_{1-x}Sn_x$ alloy (also referred to as the "NbCo" alloy), the alloy is doped with a fraction y of Sb replacing the Sn and Si in amounts proportional to x. In such embodiments, the chemical formula for the n-type semiconductor legs 204 is:

$$NbCoSi_{[(1-x)(1-y)]}Sn_{[x(1-y)]}Sb_y.$$

In embodiments of the n-type semiconductor legs 204 formed from the NbCo alloy, the doping amount y is between 0.002 and 0.03.

In embodiments of the thermoelectric module in which the p-type semiconductor legs 208 are formed of the NbCo alloy, the alloy is doped with a fraction of Ti replacing a portion of the Nb. The chemical formula for the p-type semiconductor legs 208 is $$Nb_{1-y}CoSi_{1-x}Sn_xTi_y.$$

In some embodiments of the p-type semiconductor legs 208 formed from the NbCo alloy, the doping amount is between 0.02 and 0.06.

In one particular embodiment, the molar fraction x in the $NbCoSi_{1-x}Sn_x$ alloy is between 0.27 and 0.75, while in another particular embodiment x is between 0.27 and 0.5, and in another embodiment x is between 0.27 and 0.35. In one particular embodiment of the $NbCoSi_{1-x}Sn_x$ alloy, x is between 0.27 and 0.28.

As seen in FIG. 4, the theoretical value for ZT of n-type half-Heusler phase NbCoSi (if the half-Heusler phase were stable) is approximately 1.97, while the ZT value for the n-type half-Heusler phase of NbCoSn is approximately 0.94. It is known that the ZT values for the $Si_{1-x}Sn_x$ alloys are linear with respect to the 100% Si alloy and the 100% Sn alloy. As such, the compounds with the greatest proportion of Si (or the lowest x) that are stable in the half-Heusler phase have the highest ZT. Since the ZT values are linear with respect to the theoretical Si and Sn phases, the ZT for n-type $NbCoSi_{1-x}Sn_x$ can be approximated according to the equation ZT=1.97-1.03x. Using the minimum stable half-Heusler phase x value of 0.27, the ZT of n-type doped $NbCoSi_{0.73}Sn_{0.27}$ is approximately 1.69, assuming the concentration of the doping agent is optimized.

Figure 5B:
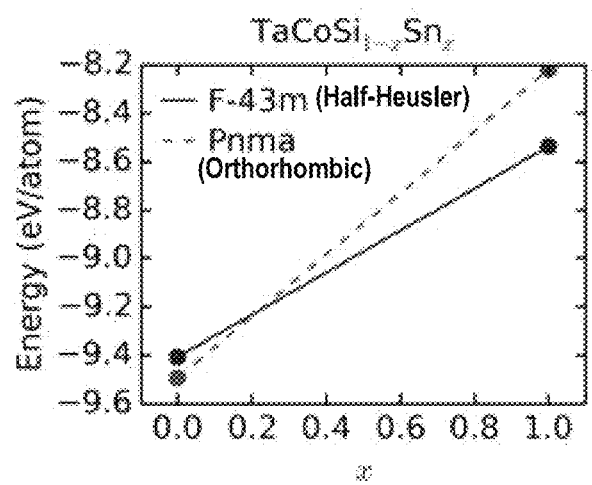
FIG. 5B is a phase diagram showing the energy levels of the half-Heusler and orthorhombic phases of $TaCoSi_{1-x}Sn_x$.
Figure 5C:
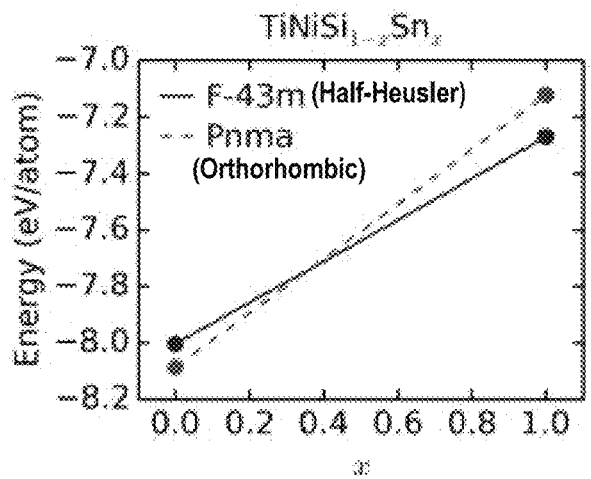
FIG. 5C is a phase diagram showing the energy levels of the half-Heusler and orthorhombic phases of $TiNiSi_{1-x}Sn_x$.
Figure 5D:
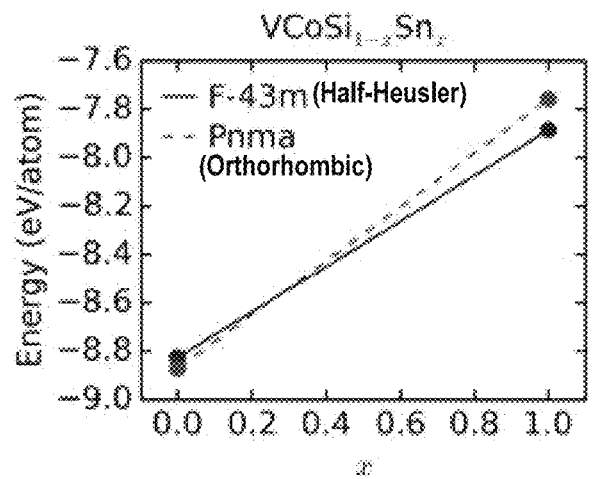
FIG. 5D is a phase diagram showing the energy levels of the half-Heusler and orthorhombic phases of $VCoSi_{1-x}Sn_x$.

In other embodiments, one or both of the n-type and p-type semiconductor legs 204 and 208, respectively, are formed of $TaCoSi_{1-x}Sn_x$, $TiNiSi_{1-x}Sn_x$, or $VCoSi_{1-x}Sn_x$ alloys. FIG. 5B illustrates the phase diagram for $TaCoSi_{1-x}Sn_x$ alloys, FIG. 5C illustrates the phase diagram for $TiNiSi_{1-x}Sn_x$ alloys, and FIG. 5D illustrates the phase diagram for $VCoSi_{1-x}Sn_x$ alloys between molar fractions of Sn (x) on the Si site of x=0 and x=1 determined using similar methodology as discussed above with regard to the $NbCoSi_{1-x}Sn_x$ alloys.

It can be seen from FIG. 5B that, for the $TaCoSi_{1-x}Sn_x$ alloy, the dashed half-Heusler and orthorhombic energy lines cross at x=0.21, indicating that the orthorhombic phase is stable at x<0.21 and the half-Heusler phase is stable at x>0.21. As is illustrated in FIG. 5C, for $TiNiSi_{1-x}Sn_x$ alloy, the half-Heusler and orthorhombic energy lines cross at x=0.36, implying that the orthorhombic phase is stable at x<0.36 and the half-Heusler phase is stable at x>0.36. For $VCoSi_{1-x}Sn_x$ alloy, FIG. 5D shows that the half-Heusler and orthorhombic energy lines cross cross at x=0.27, indicating that the orthorhombic phase is stable at x<0.27 and the half-Heusler phase is stable at x>0.27. These findings are summarized in Table 2 below:

TABLE 2

|  | Half-Heusler, F-43m (216) | Orthorombic, Pnma (62) |
|---|---|---|
| $NbCoSi_{1-x}Sn_x$ | Stable at x >0.27 | Stable at x <0.27 |
| $TaCoSi_{1-x}Sn_x$ | Stable at x >0.21 | Stable at x <0.21 |
| $TiNiSi_{1-x}Sn_x$ | Stable at x >0.36 | Stable at x <0.36 |
| $VCoSi_{1-x}Sn_x$ | Stable at x >0.27 | Stable at x <0.27 |

In some embodiments the n-type semiconductor legs 204 are formed of $TaCoSi_{1-x}Sn_x$ doped with a fraction of Sb y, which replaces a Sn and Si in amounts proportional to x. In such embodiments, the chemical formula for the n-type semiconductor legs 204 is:

$$TaCoSi_{[(1-x)(1-y)]}Sn_{[x(1-y)]}Sb_y$$

In one embodiment, the fraction y of Sb doped in the n-type semiconductor legs 204 is 0.02.

In other embodiments, the p-type doped semiconductor legs 208 are formed of $TaCoSi_{1-x}Sn_x$ doped with a fraction of Ti, which replaces a portion of the Ta. The chemical formula for the p-type semiconductor legs 208 is:

$$Ta_{1-y}CoSi_{1-x}Sn_xTi_y$$

In one embodiment, fraction y of Ti doped in the p-type semiconductor legs 208 is between 0.05 and 0.06.

In one embodiment in which the n-type and/or the p-type semiconductor legs 204 and 208, respectively, are formed of $TaCoSi_{1-x}Sn_x$, the molar fraction x of Sn to Si in $TaCoSi_{1-x}Sn_x$ is between 0.21 and 0.75. In another particular embodiment, x is between 0.21 and 0.5, and in another embodiment x is between 0.21 and 0.35. In one particular embodiment of $TaCoSi_{1-x}Sn_x$, the molar fraction x is between 0.21 and 0.22.

In another embodiment, the n-type semiconductor legs and/or the p-type semiconductor legs 204 and 208, respectively, are formed of $TiNiSi_{1-x}Sn_x$. In one embodiment, the molar fraction x in $TiNiSi_{1-x}Sn_x$ is between 0.36 and 0.75, while in another particular embodiment x is between 0.36 and 0.5, and in another embodiment x is between 0.36 and 0.40. In one specific embodiment of $TiNiSi_{1-x}Sn_x$, the molar fraction x is between 0.36 and 0.37.

In a further embodiment, the n-type semiconductor legs and/or the p-type semiconductor legs 204 and 208, respectively, are formed of $VCoSi_{1-x}Sn_x$. In one embodiment, the molar fraction x in $VCoSi_{1-x}Sn_x$ is between 0.27 and 0.75, while in another particular embodiment x is between 0.27 and 0.5, and in another embodiment x is between 0.27 and 0.35. In one embodiment of $VCoSi_{1-x}Sn_x$, x is between 0.27 and 0.28.

Alloying the Si and Sn in the above compounds also results in increased mass order scattering in the alloys. Mass order scattering is a result of the disorder due to the random distribution of the Si and Sn atoms through the alloy. Increased mass disorder scattering reduces the lattice part of the thermal conductivity ($\kappa_{lat}$), which results in increased ZT.

The alloys for the semiconductor legs 204, 208 of the thermoelectric elements 200 are formed using known powder metallurgy processes. In one particular embodiment, nanopowders are mixed in the molar proportions required to produce the desired alloy and subsequently pressed using a hot-press method so as to produce the semiconductor elements. The production of the semiconductor elements is described in further detail in Joshi, Giri et al. "Enhancement in Thermoelectric Figure-Of-Merit of an N-Type Half-Heusler Compound by the Nanocomposite Approach." *Advanced Energy Materials*, vol. 1, no. 4, p. 643, 2011, the contents of which are hereby incorporated by reference in their entirety.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the foregoing disclosure.

The invention claimed is:

1. A thermoelectric generator comprising:
a hot side heat exchanger;
a cold side heat exchanger;
a plurality of n-type semiconductor legs arranged between the hot side heat exchanger and the cold side heat exchanger; and
a plurality of p-type semiconductor legs arranged between the hot side heat exchanger and the cold side heat exchanger and alternating electrically in series with the plurality of n-type semiconductor legs,
wherein at least one of the plurality of n-type semiconductor legs and the plurality of p-type semiconductor legs is formed of an alloy having a stable half-Heusler structure and comprising Si and Sn with molar fractions of x Sn and 1−x Si, and x is less than 0.5.

2. The thermoelectric generator of claim 1, wherein the alloy comprises NbCoSi$_{1-x}$Sn$_x$ and x is greater than 0.27.

3. The thermoelectric generator of claim 1, wherein the alloy comprises TaCoSi$_{1-x}$Sn$_x$ and x is greater than 0.21.

4. The thermoelectric generator of claim 1, wherein the alloy comprises TiNiSi$_{1-x}$Sn$_x$ and x is greater than 0.36.

5. The thermoelectric generator of claim 1, wherein the alloy comprises VCoSi$_{1-x}$Sn$_x$ and x is greater than 0.27.

6. A vehicle comprising:
an engine;
an exhaust system operably connected to the engine so as to receive exhaust from the engine and discharge the exhaust to an outlet, the exhaust system including a thermoelectric generator comprising:
a hot side heat exchanger;
a cold side heat exchanger;
a plurality of n-type semiconductor legs arranged between the hot side heat exchanger and the cold side heat exchanger; and
a plurality of p-type semiconductor legs arranged between the hot side heat exchanger and the cold side heat exchanger and connected alternating electrically in series with the plurality of n-type semiconductor legs,
wherein at least one of the plurality of n-type semiconductor legs and the plurality of p-type semiconductor legs is formed of an alloy having a stable half-Heusler structure and comprising Si and Sn with molar fractions of x Sn and 1−x Si, and x is less than 0.5.

7. The vehicle of claim 6, wherein the alloy comprises NbCoSi$_{1-x}$Sn$_x$ and x is greater than 0.27.

8. The vehicle of claim 6, wherein the alloy comprises TaCoSi$_{1-x}$Sn$_x$ and x is greater than 0.21.

9. The thermoelectric generator of claim 1, wherein the alloy further comprises a first element having one element selected from the group consisting of Nb, Ta, Ti, and V.

10. The thermoelectric generator of claim 9, wherein the alloy further comprises a second element having one element selected from the group consisting of Co and Ni.

11. The thermoelectric generator of claim 10, wherein the first element is Nb, the second element is Co, and x is greater than 0.27.

12. The thermoelectric generator of claim 1, wherein x is between 0.27 and 0.50.

13. The thermoelectric generator of claim 10, wherein the first element is Ta, the second element is Co, and x is greater than 0.21.

14. The thermoelectric generator of claim 10, wherein the first element is Ti, the second element is Ni, and x is greater than 0.36.

15. The thermoelectric generator of claim 10, wherein the first element is V, the second element is Co, and x is greater than 0.27.

16. The thermoelectric generator of claim 10, wherein the plurality of n-type semiconductor elements include the alloy, and the alloy is formulated as ABSi$_{[(1-x)(1-y)]}$Sn$_{[x(1-y)]}$D$_y$, wherein A is the first element, B is the second element, and D is a doping agent.

17. The thermoelectric generator of claim 10, wherein the plurality of p-type semiconductor elements include the alloy, and the alloy formulated as A$_{1-y}$BSi$_{(1-x)}$Sn$_x$D$_y$, wherein A is the first element, B is the second element, and D is a doping agent.

18. The vehicle of claim 6, wherein x is between 0.27 and 0.50.

* * * * *